United States Patent
Knickerbocker et al.

(10) Patent No.: US 7,615,477 B2
(45) Date of Patent: Nov. 10, 2009

(54) METHOD OF FABRICATING A BGA PACKAGE HAVING DECREASED ADHESION

(75) Inventors: John U. Knickerbocker, Hopewell Junction, NY (US); Voya R. Markovich, Endwell, NY (US); Thomas R. Miller, Endwell, NY (US); William J. Rudik, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 11/566,956

(22) Filed: Dec. 5, 2006

(65) Prior Publication Data

US 2007/0099342 A1     May 3, 2007

Related U.S. Application Data

(62) Division of application No. 09/817,843, filed on Mar. 26, 2001, now Pat. No. 7,148,566.

(51) Int. Cl.
    *H01L 31/058*     (2006.01)
    *H01L 23/495*     (2006.01)
    *H01L 23/48*     (2006.01)
    *H01L 21/44*     (2006.01)

(52) U.S. Cl. ............... 438/612; 257/178; 257/188; 257/459; 257/669; 257/688

(58) Field of Classification Search ............ None
See application file for complete search history.

(56) References Cited

U.S. PATENT DOCUMENTS

| | | | |
|---|---|---|---|
| 4,478,883 A | 10/1984 | Bupp et al. | |
| 4,997,516 A | 3/1991 | Adler | |
| 5,215,645 A | 6/1993 | DiFranco et al. | |
| 5,551,627 A | 9/1996 | Leicht et al. | |
| 5,834,140 A | 11/1998 | Wolski et al. | |
| 5,840,402 A * | 11/1998 | Roberts et al. | 428/131 |
| 5,962,133 A | 10/1999 | Yamaguchi et al. | |
| 6,097,087 A | 8/2000 | Farnworth et al. | |
| 6,204,454 B1 | 3/2001 | Gotoh et al. | |
| 6,291,081 B1 | 9/2001 | Kurabe et al. | |
| 6,361,926 B1 | 3/2002 | So et al. | |
| 6,441,487 B2 | 8/2002 | Elenius et al. | |
| 2001/0013653 A1 * | 8/2001 | Shoji | 257/738 |

FOREIGN PATENT DOCUMENTS

| | | | |
|---|---|---|---|
| JP | 03-296238 | * | 12/1991 |
| WO | WO94/21097 | * | 9/1994 |

\* cited by examiner

*Primary Examiner*—Matthew C Landau
*Assistant Examiner*—James M Mitchell
(74) *Attorney, Agent, or Firm*—Connolly Bove Lodge & Hutz LLP; Anthony J. Canale

(57) ABSTRACT

Ball Grid Array packages having decreased adhesion of the BGA pad to the laminate surface and methods for producing same are provided.

4 Claims, 19 Drawing Sheets

METHOD OF FABRICATING A BGA PACKAGE HAVING DECREASED ADHESION

CROSS-REFERENCE RELATED APPLICATION

The present application is a divisional of U.S. application Ser. No. 09/817,843, filed Mar. 26, 2001 now U.S. Pat. No. 7,148,566.

FIELD OF THE INVENTION

The present invention relates to a wired board (i.e., a board provided with interconnecting conductors or wiring) for use as a BGA (ball grid array) package base for IC (integrated circuit) packages.

BACKGROUND OF THE INVENTION

In recent years, the reduced sizes and increased performances of electronic devices have generated a demand for higher integration, higher density, and higher processing speed in the semiconductor devices used for such electronic devices. To meet such a demand, packages for semiconductor devices are being developed from a pin insertion type to a surface packaging type for purposes of increasing the packaging densities thereof, and also developments have been proposed for a DIP (Dual Inline Package) type to a QFP (Quad Flat Package) type and a PGA (Pin Grid Array) type package for coping with the requirements of a multi-pin arrangement.

Of the packages thus developed, the QFP type makes it difficult to cope with a multi-pin arrangement because it is so configured that leads to be connected to a packaging substrate are concentrated only at a peripheral portion of the package when they are also liable to be deformed due to the small diameter thereof. On the other hand, the PGA type has a limitation in that it presents difficulties in coping with both high speed processing and surface packaging because it is so configured that the terminals to be connected to a packaging substrate are elongated and very collectively arranged.

Recently, to solve these problems and to realize a semiconductor device capable of coping with high speed processing, a ball grid array (BGA) package has been disclosed in U.S. Pat. No. 5,148,265, which has ball-like connection terminals over the entire packaging surface of a carrier substrate electrically connected to a semiconductor chip by gold wire bonding. In a BGA package the terminals to be connected to the packaging substrate are formed into ball-like shapes and are arrayed over substantially the entire packaging surface without deforming the leads as the case for the QFP. Therefore the pitch between the terminals become larger, thereby making surface packaging easier. Furthermore, because the connection terminals are shorter than in a QFP package, the inductance component becomes smaller and thereby the signal transmission speed becomes greater. The resulting BGA package is therefore amenable to high speed processing.

A conventional BGA package base includes a substrate made of an electrically insulating material such as alumina ceramic and a number of connection terminals or bumps formed on the main surface of the substrate. Each connection terminal includes a solder ball bonded to a bonding pad by way of a mass of solder. The bonding pad is formed on a main surface of a substrate treated by a predetermined plating process. The mass of solder typically consists of Pb—Sn eutectic solder or a similar, low melting point solder. The solder ball, itself, is made of a relatively high melting point solder, typically containing a high percentage of lead (Pb), as for example Pb90-Sn10. The solder ball is bonded to the plated surface of the bonding pad by means of the solder mass, thereby constituting a connection terminal. In use, the wired board is mounted on a printed board having bonding pads corresponding in arrangement to those of the wired board in such a manner that their connection terminals are respectively aligned with each other, and then the respective terminals are bonded, electrically connecting the wire board to the printed board.

In the prior art BGA packages, an elastic body is inserted between a semiconductor chip and terminals of a packaging substrate for relieving thermal stress produced due to a difference in thermal expansion between the laminate package substrate and the semiconductor chip. Semiconductor devices having such structures still have problems because of the thermal mismatch. There is much in the literature about the effect of thermal stressing on BGA life. The thermal stresses, attendant to multiple power on/off cycles, literally tear the pads off the package causing loss of electrical connection and failure. The industry is trying to overcome this by increasing the pad adhesion to the substrate surface. In contradistinction to current industry practice, the present invention solves the problem of thermal stress-induced failure by decreasing the adhesion to the laminate.

FIG. 1 illustrates a conventional fabrication technique. Substrate 100 is shown with a copper foil having a smooth surface 103 and a rough, dendritic surface 105 bonded to a dielectric 107. It is understood that dielectric 107 can be the dielectric of a single or multilayer substrate. The surface of dielectric 107 is imparted with a rough texture through lamination with the dendritic side of the external copper foil. Turning to FIG. 2 conventional subtractive circuitization is illustrated. A negative acting photoresist 209 is applied to the upper surface of copper foil 203. After development, openings 211 are formed in the resist. FIG. 3 illustrates the prior art BGA pad after etching and stripping of the resist. BGA pad 309 is shown anchored to dielectric 307 by the dendritic copper surface 305. It is understood that substantially the entire surface topography of dielectric substrate 300 is dominated by a "replica" of the dendritic surface. The dendritic topography provides enhanced adhesion. During thermal stressing of the laminate, such as power on/off cycling, the BGA pads remain 'anchored' to the laminate surface through this dendritic structure. As the laminate surface expands and contracts with the thermal excursions the BGA pad moves with the surface. This can place excessive stress on the package. The solder ball anchors the pad to the chip. As the BGA pad moves with the laminate, the stress can fracture the solder connection causing failure. Accordingly, it would be desirable to provide enhanced BGA life. The present invention achieves this goal by reducing the adhesion of the BGA pad to the laminate.

SUMMARY OF INVENTION

The present invention relates to a method of fabricating a BGA package having decreased adhesion of the BGA pad to the laminate surface. The present invention further relates to the BGA package fabricated using the inventive method. One aspect of the present invention is concerned with a method which comprises applying dendritic foil to the laminate surface of the package, selectively masking the dendritic foil leaving the BGA target area unmasked, and subsequently smoothing the exposed surface of the dendritic foil.

According to another aspect of the present invention decreased adhesion of the BGA pad to the laminate surface is achieved through the use of a weakly adherent smooth foil.

According to a further aspect of the present invention, an electrically-conductive, "springboard" means is interposed between the BGA pad and the laminate surface. The springboard facilitates electrical conduction while permitting the BGA pad to move independently of the laminate surface in response to thermal cycling.

According to an aspect of the invention the springboard means comprise: a semiconductor substrate; a first compliant dielectric layer formed over said substrate and having at least one first opening formed therein; a first BGA pad formed in said first opening and in electrical contact with said substrate; a second compliant dielectric layer formed over said first compliant layer and having at least one second opening formed therein wherein said second opening is substantially offset from said first opening; a second BGA pad formed in said second opening and in electrical contact with said first BGA pad; a soldermask layer formed over said second compliant layer and having a third opening therethrough in communication with said second BGA pad; a solder ball solderably connected to said second BGA pad and extending through said third opening.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

Figure 1:
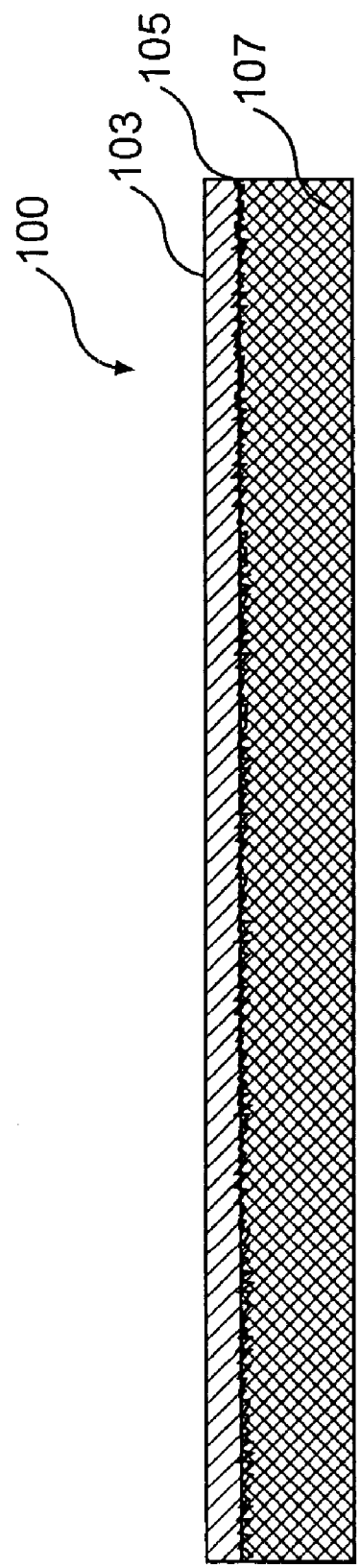
FIGS. 1-3 illustrate fabrication of a prior art BGA pad.
Figure 2:
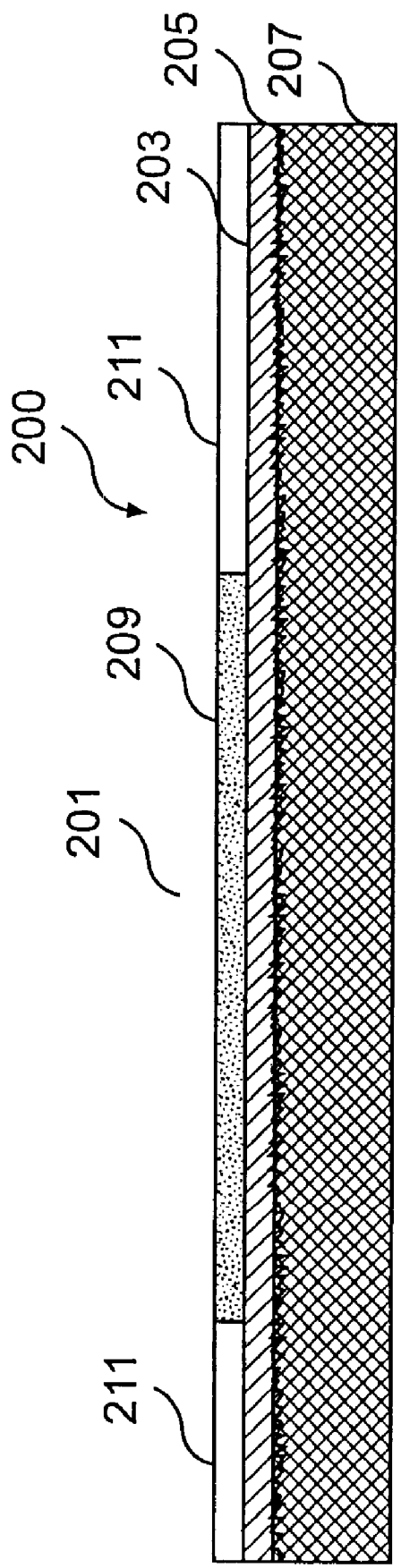
Figure 3:
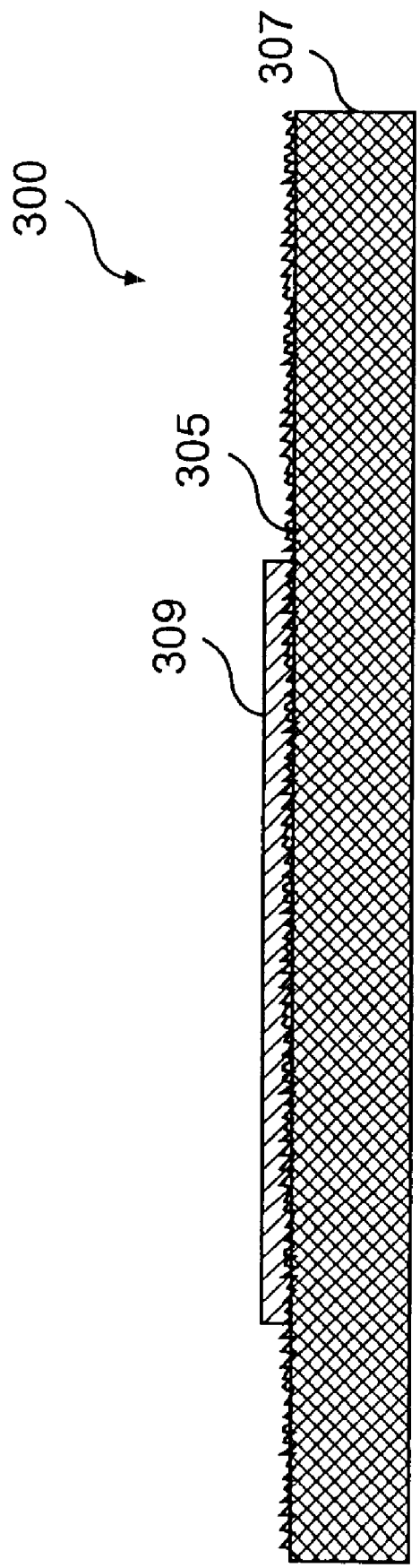

In conventional fabrication, as discussed hereinabove with respect to prior art FIGS. 1-3, the laminate surface is imparted with a 'rough' surface through lamination with an external copper foil. Increased adhesion is provided by the dendritic structure 105 of the copper foil penetrating into the laminate. In conventional subtractive circuitization the dendritic side of the copper foil is the primary means of adhesion. This adhesion is further promoted by individual suppliers proprietary means of creating the dendritic structure or by chemical treatments that a supplier may apply to the dendritic "treated" side of the foil. Where the foil has been etched from the dielectric, the replicate structure imparted by the rough side of the foil is still present and will afford enhanced adhesion of soldermasks, photoresists, etc in downstream processes. Although the final BGA structure is not shown, additional processing such as precious metal plating, soldermasks, etc., follow the circuitization, with the resultant structure having a solder ball on the BGA pad. Where the foil has been etched to produce a replicate surface, the dendritic topography remains affording enhanced adhesion. During thermal stressing of the laminate, such as on and off powering cycling, the BGA pads 309 remain 'anchored' to the laminate surface through this dendritic structure. The BGA pad is also constrained in place by the aforementioned solder ball that in the final structure is connected to the main PWB package assembly. As the laminate surface expands and contracts with the thermal excursions the BGA pad 309 moves with the surface. This can place excessive stress on the package which results in either a fracture in the solder ball or fracture of the respective circuit traces associated the BGA pad on the carrier or the assembled PWB.

Figure 4:
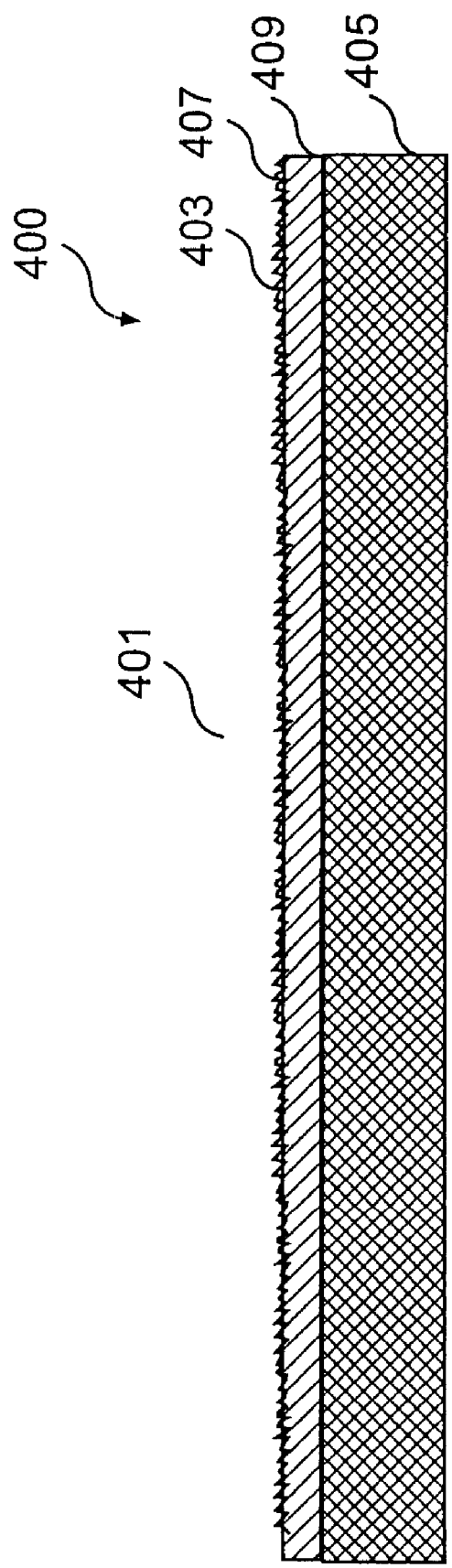
FIGS. 4-6 illustrate fabrication of a first embodiment of the inventive BGA pad.

Turning now to FIG. 4, the present invention comprises a BGA package having decreased adhesion of the BGA pad to the laminate surface. In a first embodiment, the upper surface 401 of dielectric substrate 400 is laminated with external copper foil 407 but in contrast with the prior art, the present invention contacts the less adhesive, shiny side 409 of the foil with the laminate surface 405.

Figure 5:
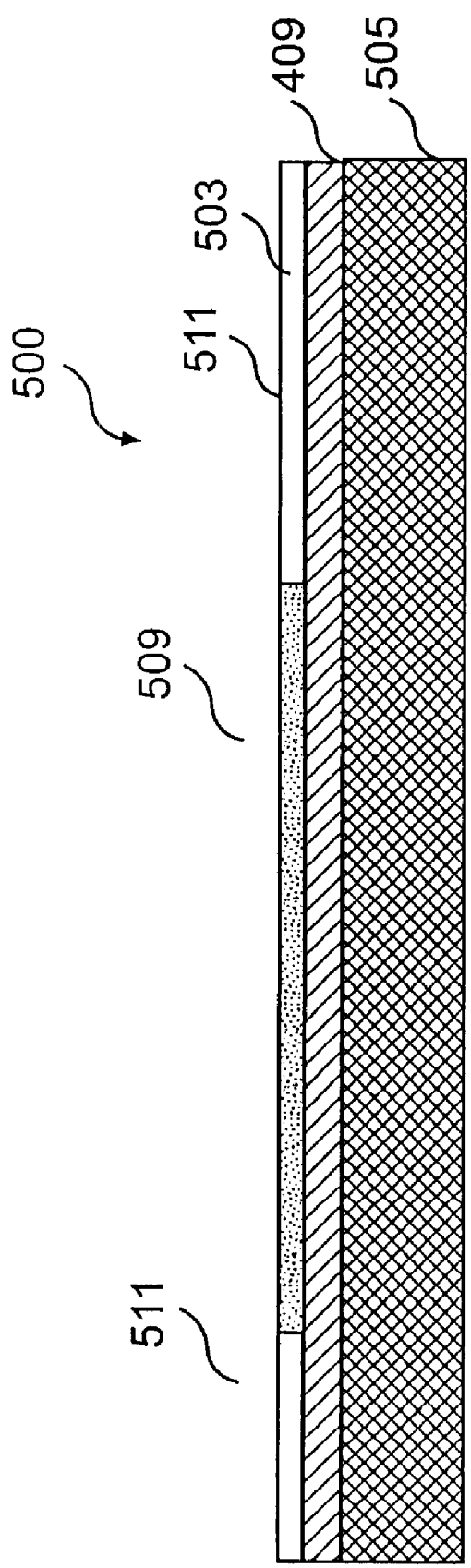
Figure 6:
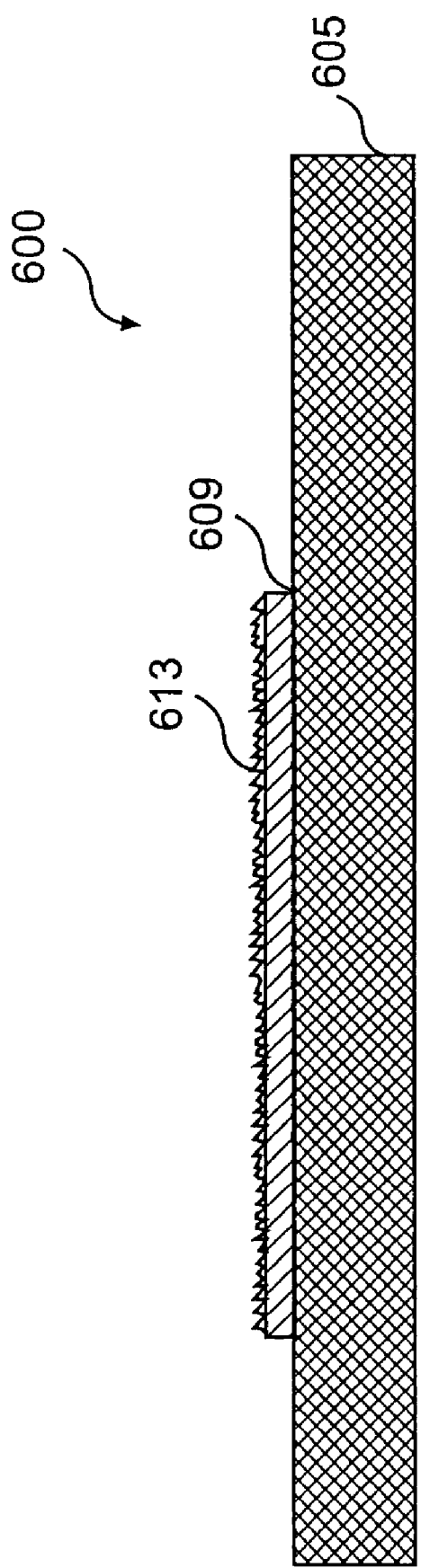

Turning now to FIG. 5, conventional subtractive circuitization processes are performed. A negative acting photoresist 509 is applied to the upper surface (in this embodiment, the dendritic surface) of copper foil 503. After development, openings 511 are formed in the resist 509. With reference to FIG. 6, illustrating the inventive BGA pad after etching and stripping of the resist 509. BGA pad 613 is shown laminated to dielectric 605 by the smooth copper surface 609. The smooth topography provides decreased adhesion relative to that provided by the dendritic surface of the prior art BGA pad. During thermal stressing, the inventive BGA pad 613 has an enhanced ability to move relative to the surface of dielectric 605. Thus the stress applied to the solder balls is decreased reducing the tendency to fracture the solder connections and thereby reducing the occurrence of failures.

Figure 7:
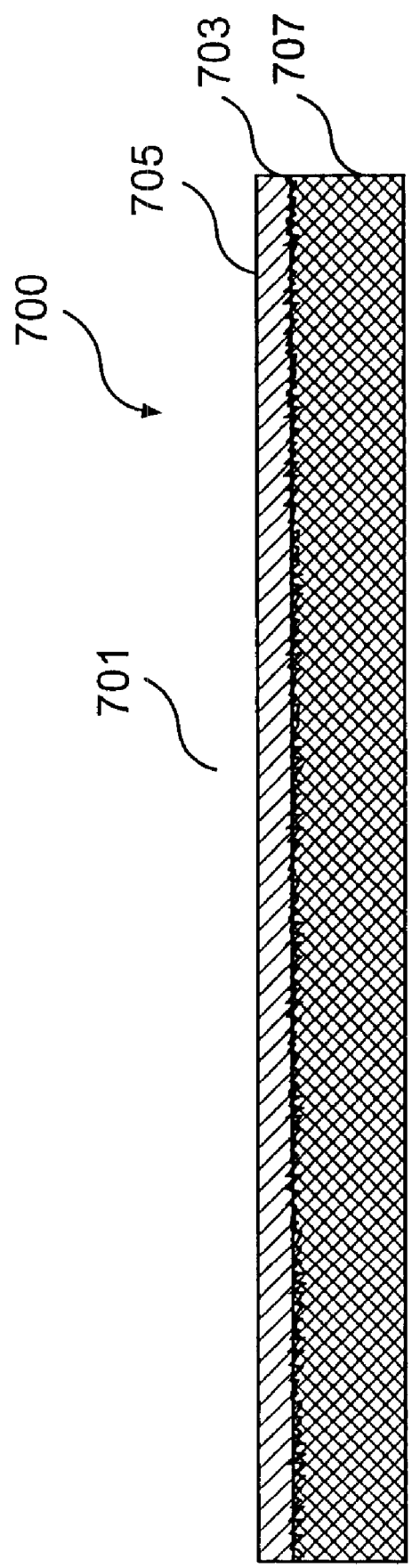
FIGS. 7-11 illustrate fabrication of a second embodiment of the inventive BGA pad.
Figure 8:
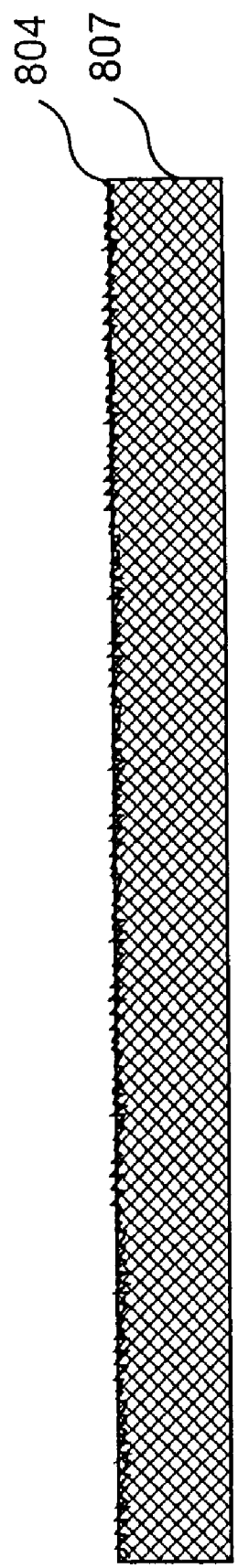

Turning now to FIG. 7, fabrication of a second embodiment of the present invention as an pattern plated structure plate is illustrated. Copper foil 705 is laminated to dielectric substrate 707 in the conventional manner such that the dendritic side 703 of the copper foil contacts and imparts a roughened topology to the top surface of dielectric 707. The smooth side of the copper is located as the top surface 701. The surface copper is etched off, exposing the dielectric surface 804 now having a dendritic topology as illustrated in FIG. 8.

Figure 9:
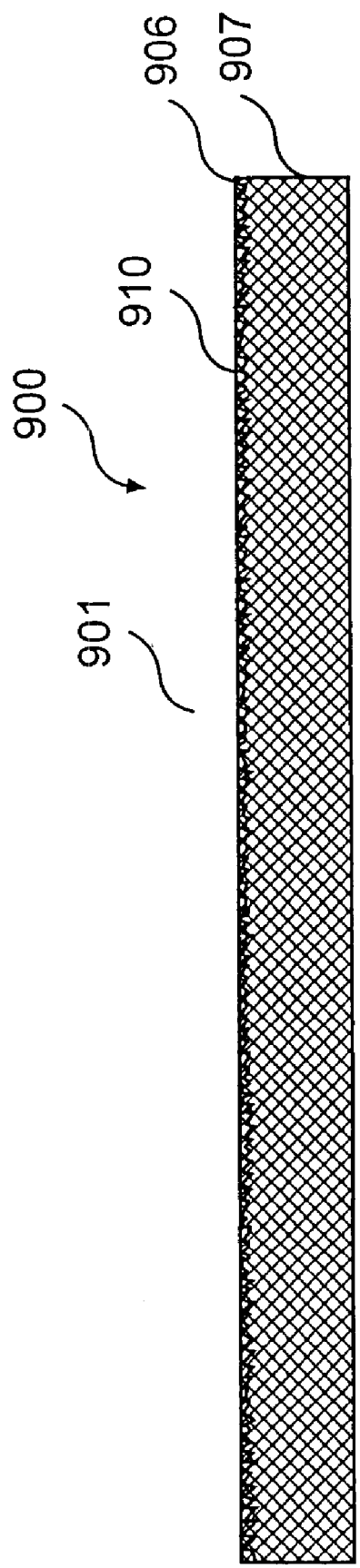

Turning to FIG. 9, the dielectric surface topology is smoothed by any of the techniques known in the art such as plasma, vapor, or other chemical or mechanical attack. These techniques are standard to the art and need not be discussed herein in any detail. Substantially the entire dielectric surface 906 may be smoothed or optionally, the surface may be masked and only selected portion where the BGA pad will be subsequently sited may be treated. Following smoothing, a first metallization layer, comprising a catalyst seed layer 910 is applied. Metallization of dielectric substrates, such as by such as by the deposition of a palladium, palladium/tin or other similar catalysts to initiate metal plating is known to the art. Further, to one skilled in the art of metal depositions, the catalyzing layer could be thin sputter or electrodeposited metal layer.

Figure 10:
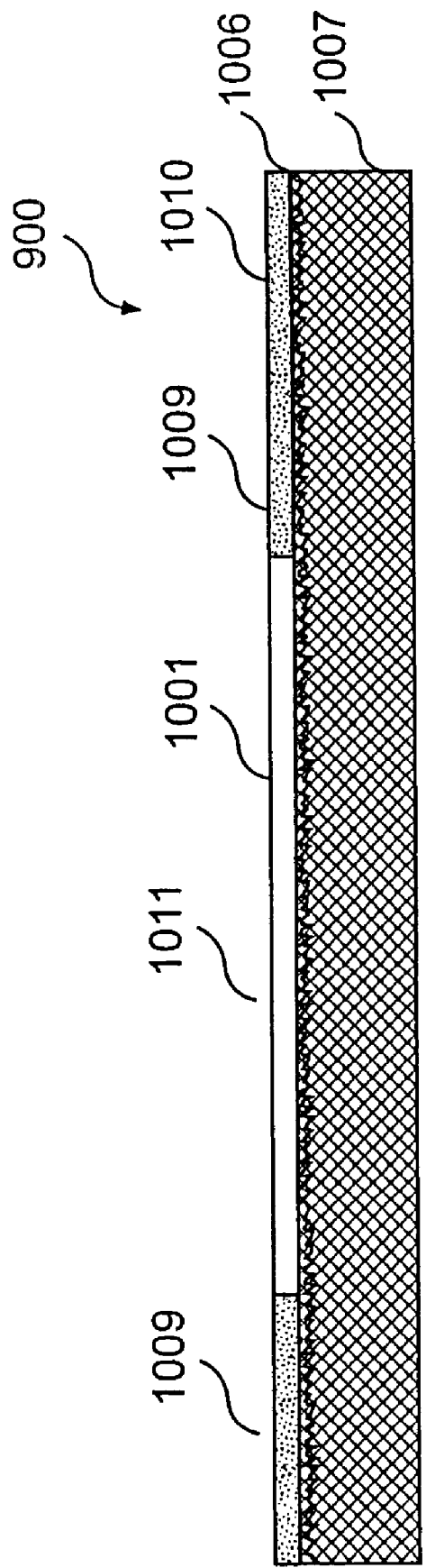
Figure 11:
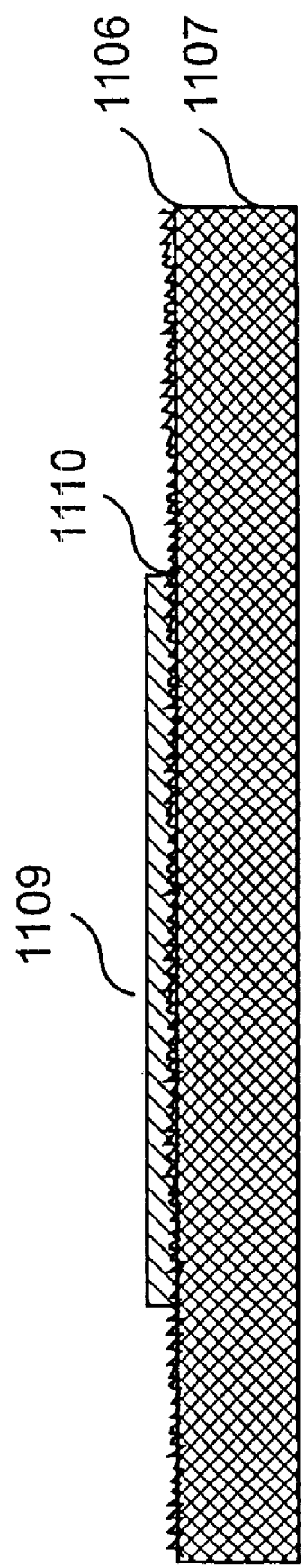

Turning to FIG. 10. A layer of photoresist 1009, patterned with openings 1011, is applied to the smoothed dielectric surface 1006. Moving to FIG. 11, the inventive BGA pad 1109 is shown after a second metallization and photo resist strip steps. It is understood that the second metallization step to form the BGA pad 1109 is preferably copper, but could be nickel, gold, palladium. It is further understood that the second metallization can be by electroless or electrolytic means, methods of which are known to the art and do not need explanation here. These methods may utilize multiple plating steps to achieve the required pad height. Optionally, the catalyst layer 910 may be removed. This embodiment shows the inventive feature of the present invention wherein a copper pad is low adhesively bonded to the dielectric thus permitting a degree of relative motion.

Figure 12:
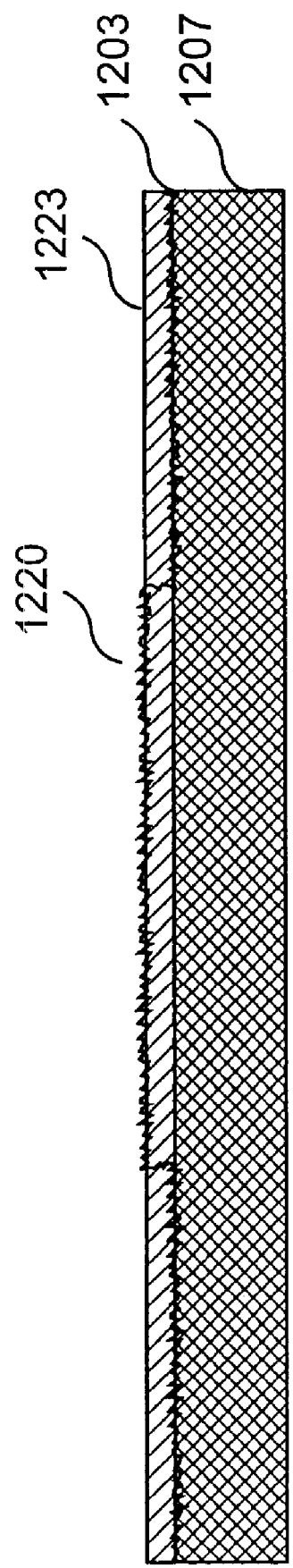
FIG. 12 illustrates fabrication of a third embodiment of the inventive BGA pad.

With reference to FIG. 12 a third embodiment is disclosed. The upper surface of dielectric 1207 is laminated with copper foil such that those areas intended for the BGA pad are laminated with "flipped" copper foil 1220. In the alternative, those areas intended for the BGA pad may be laminated with copper bearing a low dendritic profile. In either case, the remaining areas of the laminate may be laminated with the normal, dendritic side 1203 of copper foil 1223. The BGA pad may be provided by the subtractive path as given for the first embodiment or by the additive path as given for the second embodiment as described hereinabove.

Figure 13:
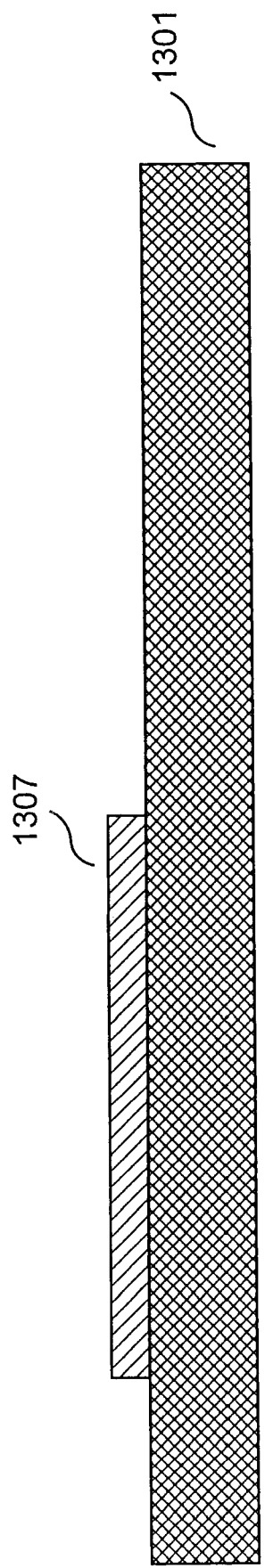
FIGS. 13-19 illustrate fabrication of a fourth embodiment of the inventive BGA pad.

Turning to FIG. 13, fabrication of a fourth embodiment of the present invention is disclosed. This embodiment creates a "springboard" type structure for a BGA pad that survives the thermal stresses and creates a robust package. In the first step, BGA pad is formed on a dielectric substrate by means of either a subtractive or pattern plating method.

Figure 14:
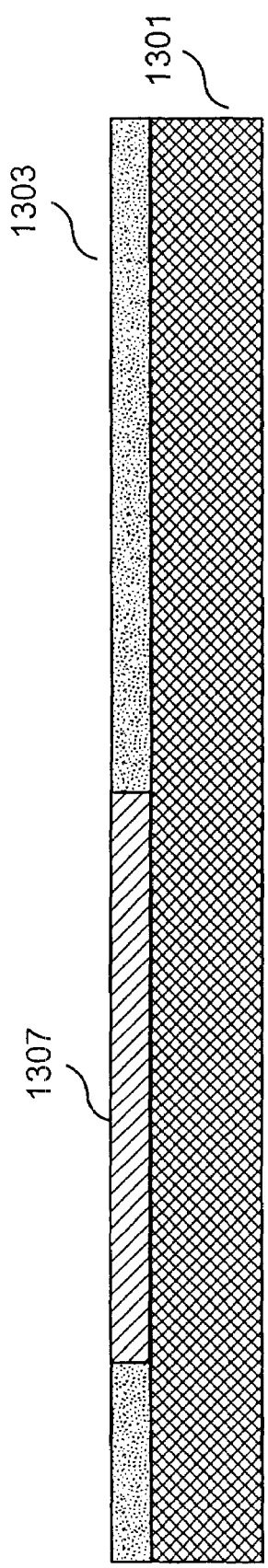

The next step in creating this inventive structure is shown in FIG. 14. The BGA pad created and dielectric surface is encapsulated by layer 1303. Layer 1303 can be either a photoresist material, an epoxy prepreg type material or a photoimageable dielectric material. Application of the material is by methods known in the industry such as vacuum or hot roll lamination. It is also understood and recognized by those skilled in the art that a preferred method for creating the step shown in FIG. 14 is by the use of a pattern plating method into the openings formed in a permanent resist material. Use of a patterned permanent material eliminates the process steps associated with the lamination for cleaning excess material for the BGA pad surface.

Figure 15:
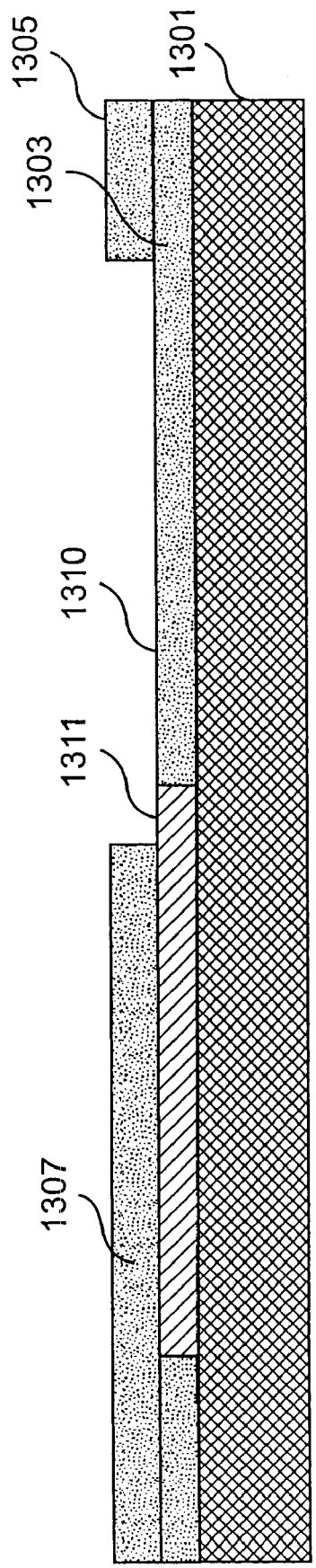

In FIG. 15, a first method of forming what will be a second BGA pad is shown. A photoresist material 1305 is applied over the top surface and an opening 1310 is formed through photolithographic or laser ablation techniques. Note that the first BGA pad 1307 is only partially exposed through opening 1310. It is understood that the amount of exposed pad 1307 in opening 1310 is application design dependent and may be tailored for the amount of thermal stressing needed. The top surface of pad 1307 in the opening is shown as 1311. It is also further understood that resist 1305 may also be a permanent photoresist or photoimageable dielectric material.

Figure 17:
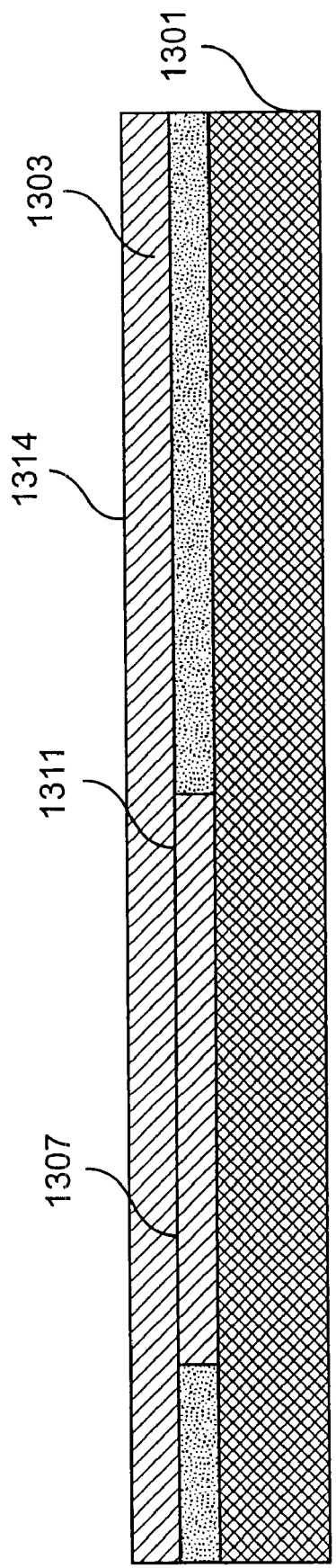

In FIG. 17, a second BGA pad 1309 is created in the opening 1310. This pad may be created by any metal deposition process available. A full build electroless process is preferred. Other full panel metallization processes may be used to create the structure shown in FIG. 14. These may employ the use of a thin commoning layer deposited over the top surface and into opening 1310 followed by the subsequent plating, masking and commoning layer etching processes. Still other methods such as magion or sputter or evaporative plating methods could be used to create the upper pad. These other methods may include preparation steps prior to metallization such as roughening the bottom pad surface or layer 1303 or the application of the catalyst. This invention is not limited to the metallization method chosen. It is also preferential in this embodiment that the top surface of 1303 inside opening 1310 not be made too rough that it provides too much adhesion and thus loose the advantage gained by this structure. It is also noted that the previously exposed portion of the lower pad 1311, may contain at the interface, any metals or catalysts as needed by the alternate metallization processes.

In FIG. 17, a second method is shown for formation of the upper pad. A second copper foil layer 1314 is laminated to the top surface of the structure shown in, FIG. 14. To facilitate lamination, the top surface of the lower pad 1307 can be plated with a soft metal such as gold or may have an conductive adhesive applied to the surface prior to lamination. The metal to metal bond created without these extra steps is still sufficient to produce the results need.

Figure 16:
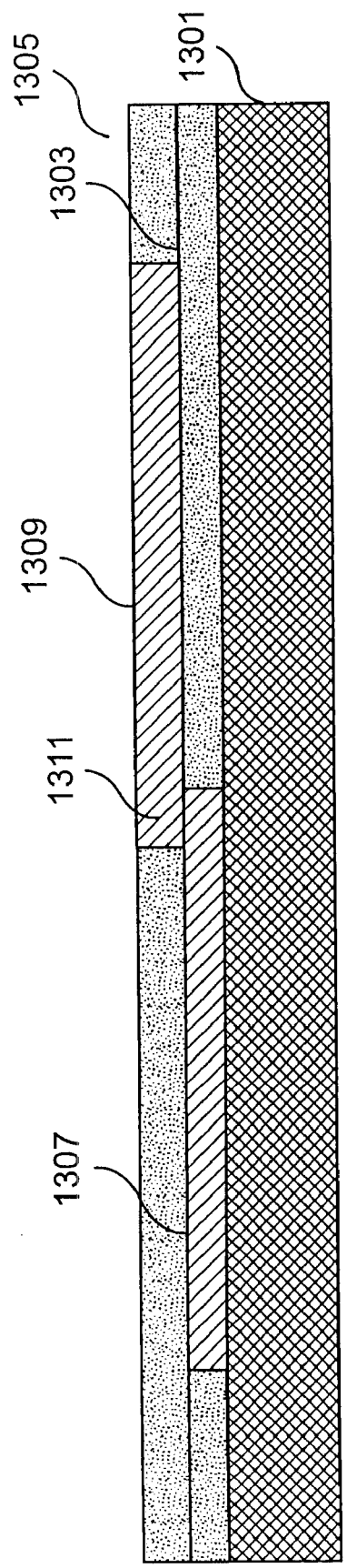
Figure 18:
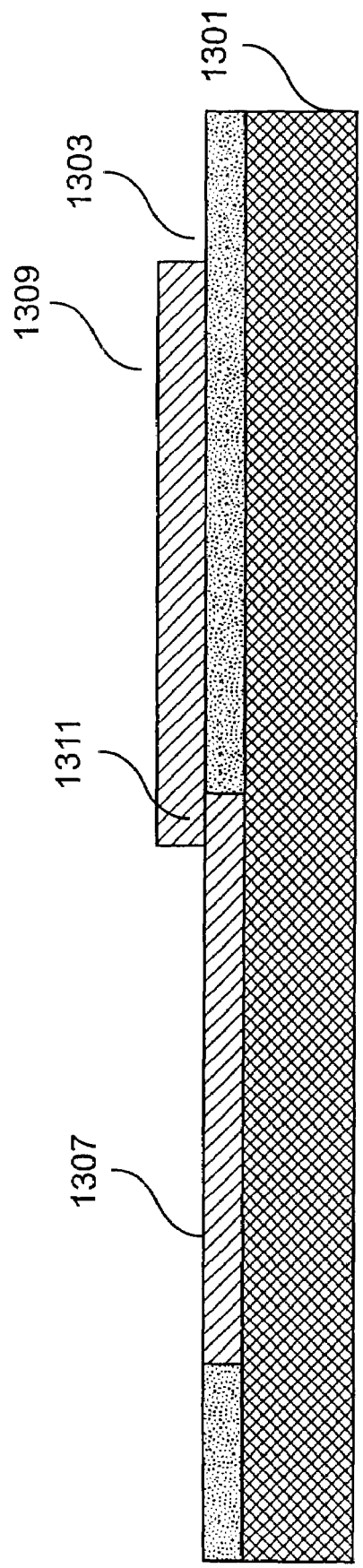
Figure 19:
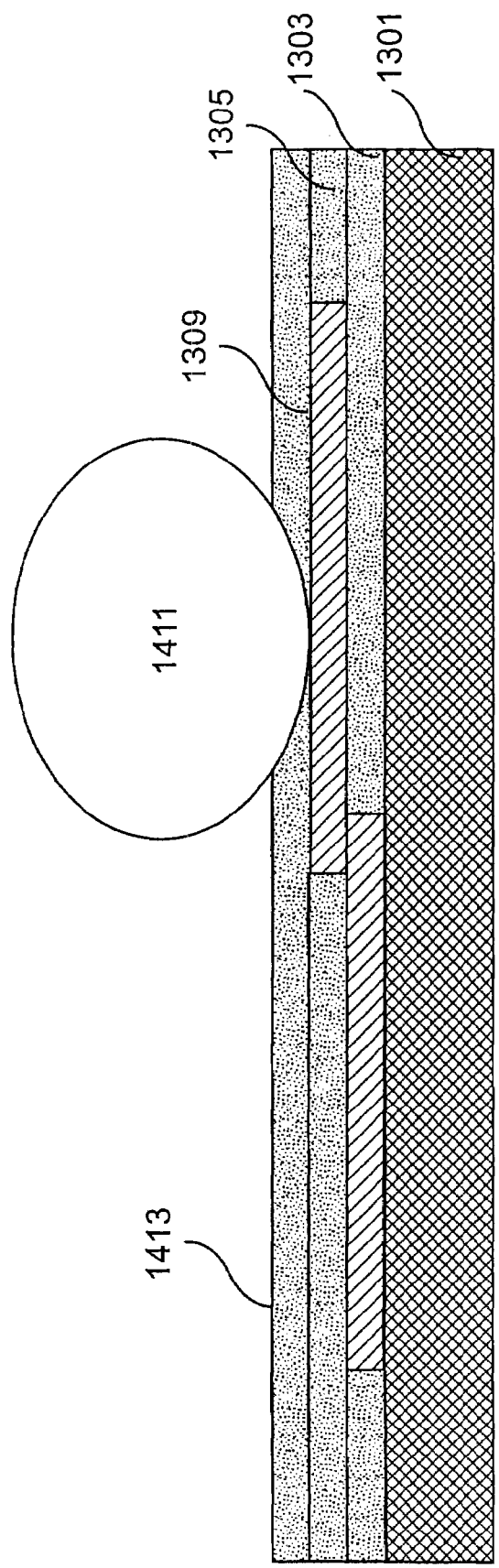

In FIG. 18, the upper pad 1309, is created by a subtractive method with the overlap area 1311 made to match the design criteria. Surface 1311 on pad 1307 may contain the soft metal or conductive adhesive if used. After the application of a permanent resist or prepreg layer a structure similar to that obtained and shown previously in FIG. 16 is accomplished. It is understood from all embodiments presented that the final structure of the BGA package includes the processes required to produce a solder ball on the pad. In FIG. 19, one such final structure showing the solder ball is shown. A soldermask or similar material 1413 is applied over the surface and openings created over the BGA pad for the solder. Methods for the final masking, creating the opening, the size of the opening and soldering processes are known to the art and are obvious to those skilled in the art.

According to a further embodiment of the invention smoother foils are used. The roughness of the shiny side of the copper foil is controlled by the grade of aluminum on which the copper is electroplated. Typically the shiny side of copper foils has a roughness less than about 5.0 microns. The present invention uses copper foils wherein the shiny side has a surface roughness of from about 0.01 microns to about 2.0 microns and preferably less than about 1.0 microns.

It is understood that where copper foil is specified, any suitable electrically conductive foil may be substituted.

It is understood that where a BGA pad is specified, any electrical contact pad may be substituted.

It will, therefore, be appreciated by those skilled in the art having the benefit of this disclosure that this invention is capable of producing electrical contact packages and specifically BGA packages having decreased adhesion of the BGA pad to the laminate surface. Moreover, it will be appreciated that the invention discloses methods for fabricating such packages. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Accordingly, the description is not intended to limit the invention to the form disclosed herein. Also, it is intended that the appended claims be construed to include alternative embodiments.

What is claimed is:

1. A method of fabricating an electronic package having selectively controlled contact pad laminate surface adhesion comprising:
   providing a dielectric substrate having a major surface;
   providing a conductive foil wherein said foil has at least one side having a smooth portion thereof;
   laminating said conductive foil to said major surface wherein said smooth portion contacts said major surface;
   applying a negative acting resist to said conductive foil;
   developing said resist forming openings;
   etching exposed conductive foil, wherein said etching forms a connection pad,
   wherein said smooth portion has a surface roughness less than about 1.0 micron and moves relative to the dielectric surface during thermal stress thereby reducing a tendency to fracture an electronic connection.

2. A method of fabricating an electronic package having selectively controlled contact pad-laminate surface adhesion, according to claim 1, wherein said conductive foil comprises any conductive material selected from the group consisting of copper, aluminum, gold, silver, nickel, and chrome.

3. A method of fabricating an electronic package having selectively controlled contact pad-laminate surface adhesion, according to claim 1, wherein said conductive foil comprises any material having high electrical conductivity.

4. A method of fabricating an electronic package having selectively controlled contact pad-laminate surface adhesion, according to claim 1, wherein said smooth side has a surface roughness about 0.01 micron.

* * * * *